(12) United States Patent
Zhu

(10) Patent No.: US 10,094,881 B2
(45) Date of Patent: Oct. 9, 2018

(54) BATTERY FUEL GAUGING SYSTEM

(71) Applicant: DONGGUAN CELLWISE MICROELECTRONICS CO., LTD., Dongguan (CN)

(72) Inventor: Weili Zhu, Dongguan (CN)

(73) Assignee: DONGGUAN CELLWISE MICROELECTRONICS CO., LTD., Dongguan, Guangdong Province (CN)

(*) Notice: Subject to any disclaimer, the term of this patent is extended or adjusted under 35 U.S.C. 154(b) by 459 days.

(21) Appl. No.: 14/768,603

(22) PCT Filed: Jul. 31, 2013

(86) PCT No.: PCT/CN2013/080465
§ 371 (c)(1),
(2) Date: Aug. 18, 2015

(87) PCT Pub. No.: WO2014/131264
PCT Pub. Date: Sep. 4, 2014

(65) Prior Publication Data
US 2016/0003913 A1 Jan. 7, 2016

(30) Foreign Application Priority Data
Feb. 28, 2013 (CN) .......................... 2013 1 0064218

(51) Int. Cl.
*G06F 19/00* (2018.01)
*G01R 31/36* (2006.01)
*H01M 10/48* (2006.01)
*H01M 10/052* (2010.01)

(52) U.S. Cl.
CPC ....... *G01R 31/3651* (2013.01); *G01R 31/362* (2013.01); *G01R 31/3637* (2013.01); *G01R 31/3655* (2013.01); *H01M 10/48* (2013.01); *H01M 10/052* (2013.01)

(58) Field of Classification Search
CPC . H01M 10/48; G01R 31/3651; Y02T 10/7011
USPC ..................................... 702/64, 63, 182–185
See application file for complete search history.

(56) References Cited

U.S. PATENT DOCUMENTS 8,170,818 B2* 5/2012 Lin .................... G01R 31/3651
702/63

* cited by examiner

*Primary Examiner* — Edward Raymond
(74) *Attorney, Agent, or Firm* — Cheng-Ju Chiang

(57) ABSTRACT

The present disclosure discloses a battery fuel gauging system, which includes a battery voltage collecting module and a microprocessor module. An input terminal of the battery voltage collecting module is configured to collect a terminal voltage of the battery. The microprocessor module is configured to receive the terminal voltage and estimate the remaining charge in the battery. The microprocessor module estimates an open-circuit voltage of the battery according to the terminal voltage of the battery and a built-in battery model, and further calculates the battery's remaining charge based on SOC-OCV relations of a typical lithium-ion battery. The present disclosure is capable of maintaining the precision of the battery fuel gauging system and can set the battery fuel gauging system inside or outside of the battery.

19 Claims, 2 Drawing Sheets

BATTERY FUEL GAUGING SYSTEM

RELATED APPLICATION

This application is a national phase entry under 35 USC 371 of International Patent Application No. PCT/CN2013/080465 filed on 31 Jul. 2013, which claims priority from Chinese Patent Application No. 2013100642189 filed on 28 Feb. 2013, the disclosures of which are incorporated in their entirety by reference herein.

FIELD OF THE DISCLOSURE

The present disclosure relates to the field of electronics, and more specifically, relates to a battery fuel gauging system.

BACKGROUND OF THE DISCLOSURE

Nowadays, with the widespread use of cellphones and other battery-powered electronic devices, battery fuel gauging is paid with more and more attention by developers of electronic devices. As is shown in FIG. 1, which is a structural diagram of a battery fuel gauging system in the prior art. Today's battery fuel gauging system generally comprises a microprocessor module 11, a current sensor module 12 and a current-sense resistor Rs. Due to the fact that the current-sense resistor Rs must be set inside the battery and the microprocessor module 11 is directly powered by the battery, the battery fuel gauging system can only be located inside the battery. The microprocessor module 11 can keep data exchange via the universal communication interface with the processor of the electronic device. When the battery fuel gauging system is working properly, it needs to continuously collect a terminal voltage between the two terminals of the current-sense resistor Rs, and calculate the real-time current in order to get the remaining charge in the battery. When the entire electronic device is turned into a sleep mode, a standby mode or a ultra-low-power mode, the battery fuel gauging system will still collect the terminal voltage and utilize the SOC-OCV relevance, i.e., the relevance between state of charge and open-circuit voltage in order to correct the charge estimation offset.

While the prior art has at least the following disadvantages:

1. The battery fuel gauging system in the prior art has relatively high power consumption. Specifically, when the system is working, it needs to monitor in real time the magnitude of the current; otherwise the charge amount cannot be accurately accumulated. Thus, the sampling system must be kept in a real-time working condition, in other words, the sampling module must be working in a continuously active state, and this leads to the consequence that the system's overall power will always remain at a relatively high level and it is impossible for the system to actively adjust its working state according to load conditions.

2. When the system is working, it cannot autonomously eliminate the inevitable long-term charge offset in current sampling, thus it cannot automatically correct the deviation under a normal working state. Since the current sense resistor itself has limited precision, the accumulated error caused thereby can only be corrected when the system is turned into the sleep mode, the standby mode or the ultra-low-power mode, by utilizing an open-circuit voltage acquired from voltage sampling to perform the charge correction. When the system is in a continuous working state or in a condition of repeatedly charging or discharging, then it cannot autonomously monitor the system error, thus affecting the precision when the system is working continuously or is being repeatedly charging or discharging. When the system is in the sleep mode, the standby mode or the ultra-low-power mode, the charge correction is generally performed in an abrupt manner, i.e., the charge update is performed immediately after the sampling is completed, thus, the display of the charge level would change abruptly when the electronic device is switched on or off.

3. The battery fuel gauging system in the prior art can only be set inside the battery.

SUMMARY OF THE DISCLOSURE

A primary technical problem the present disclosure attempting to solve is to provide a battery fuel gauging system which is capable of maintaining its precision and can be set inside or outside of the battery.

To solve the above mentioned technical problem, one technical solution adopted by the present disclosure is: to provide a battery fuel gauging system which comprises a battery voltage collecting module and a microprocessor module, wherein an input terminal of the battery voltage collecting module is connected to the battery and configured to collect a terminal voltage of the battery. The battery voltage collecting module works intermittently. The microprocessor module is connected to an output terminal of the battery voltage collecting module and configured to receive the terminal voltage of the battery and estimate the remaining charge in the battery. The microprocessor module estimates an open-circuit voltage of the battery according to the terminal voltage of the battery and a built-in battery model, and further calculates the battery's remaining charge based on SOC-OCV relations of a typical lithium-ion battery. The built-in battery model can be described by the following equation set:

$$V_o(t) = V_{ocv}(t) - I_1(t) * R_1 - I_2(t) * R_2 \quad (1)$$

$$I_2(t) * R_2 = V_{C_1}(t) \quad (2)$$

$$\int_0^t \frac{I_2 - I_1}{C_1} dt = V_{C_1}(t) \quad (3)$$

$$SOC(t) = SOC(0) - \int_0^t I_1(t) dt \quad (4)$$

wherein, $V_o(t)$ represents the terminal voltage of the battery, $V_{ocv}(t)$ represents the open-circuit voltage of the battery, $R_1$ represents an equivalent ohmic resistance of the battery, $R_2$ represents an equivalent polarization differential resistance, $I_1(t)$ represents the charge current or discharge current of the battery, $I_2(t)$ represents the current flowing through the equivalent polarization differential resistance $R_2$, $SOC(t)$ is the present remaining charge in the battery, and $SOC(0)$ is the initial charge amount of the battery. The current open-circuit voltage of the battery will be calculated according to the built-in battery model in conjunction with the presently collected terminal voltage of the battery, and the present open-circuit voltage of the battery will be further utilized to calculate the remaining charge in the battery according to the SOC-OCV relations of the typical lithium-ion battery.

Wherein, a relational table with regard to the open-circuit voltage of the battery and the remaining charge is established according to characteristics of the battery, and the open-circuit voltage can be calculated according to the terminal voltage of the battery, and further the corresponding remaining charge can be obtained by looking up the table. If the open-circuit voltage of the battery is amidst a plurality of discrete data points, then linear interpolation will be utilized to calculate the remaining charge in the battery.

Wherein, relational data with regard to the open-circuit voltage of the battery and the remaining charge will be established according to the characteristics of the battery, and a relational polynomial set correlating the open-circuit voltage of the battery and the remaining charge can be retained, further the open-circuit voltage of the battery can be calculated according to the terminal voltage of the battery, and finally the open-circuit voltage will be substituted into the polynomial set directed to the relations between the open-circuit voltage of the battery and the remaining charge.

To solve the above-mentioned technical problem, another technical solution adopted by the present disclosure is: to provide a battery fuel gauging system, which comprises a battery voltage collecting module and a microprocessor module. An input terminal of the battery voltage collecting module is connected to the battery. The voltage collecting module is configured to collect a terminal voltage of the battery and convert the terminal voltage into digital voltage signals and output the digital voltage signals. The microprocessor module is connected to an output terminal of the battery voltage collecting module, and is configured to receive the terminal voltage of the battery and estimate the remaining charge in the battery. The microprocessor module estimates an open-circuit voltage of the battery according to the terminal voltage of the battery in conjunction with a built-in battery model, and further calculates the battery's remaining charge based on SOC-OCV relations of a typical lithium-ion battery.

Wherein, the battery voltage collecting module comprises a voltage sampling unit and an analog-to-digital conversion unit.

Wherein, the voltage sampling unit may be a switched capacitor circuit or a high input resistance amplifier.

Wherein, the voltage sampling unit comprises a low pass filter at its front end.

Wherein, the battery voltage collecting module works intermittently.

Wherein, the microprocessor module may be a digital signal processor (DSP).

Wherein, the microprocessor module may also be a programmable logical device programmed with certain algorithms.

Wherein, the built-in battery model can be described by the following equation set:

$$V_o(t) = V_{ocv}(t) - I_1(t) * R_1 - I_2(t) * R_2 \quad (1)$$

$$I_2(t) * R_2 = V_{C_1}(t) \quad (2)$$

$$\int_0^t \frac{I_2 - I_1}{C_1} dt = V_{C_1}(t) \quad (3)$$

$$SOC(t) = SOC(0) - \int_0^t I_1(t) dt \quad (4)$$

wherein, $V_o(t)$ represents the terminal voltage of the battery, $V_{ocv}(t)$ represents the open-circuit voltage of the battery, $R_1$ represents an equivalent ohmic resistance of the battery, $R_2$ represents a polarization differential resistance, $I_1(t)$ represents the charge current value or discharge current value of the battery, $I_2(t)$ indicates the current flowing through the equivalent polarization differential resistance, SOC(t) is the present remaining charge in the battery, and SOC(0) is the initial charge amount of the battery. The current open-circuit voltage of the battery will be calculated according to the built-in battery model in conjunction with the presently collected terminal voltage of the battery, and the current open-circuit voltage of the battery will be further utilized to calculate the remaining charge in the battery according to the SOC-OCV relations of the typical lithium-ion battery.

Wherein, a relational table correlating the open-circuit voltage of the battery and the remaining charge is established according to characteristics of the battery, and the open-circuit voltage will be calculated according to the terminal voltage of the battery, and further the corresponding remaining charge will be obtained by looking up the table. If the open-circuit voltage of the battery is amidst a plurality of discrete data points, then linear interpolation will be utilized to calculate the remaining charge in the battery.

Wherein, relational data pertaining to the open-circuit voltage of the battery and the remaining charge will be established according to the characteristics of the battery, and a relational polynomial set correlating the open-circuit voltage of the battery and the remaining charge can be retained, further the open-circuit voltage of the battery can be calculated according to the terminal voltage of the battery, and finally the open-circuit voltage will be substituted into the polynomial set correlating the open-circuit voltage of the battery and the remaining charge.

The beneficial effect of the present disclosure is: differing from the prior art, the present disclosure estimates an open-circuit voltage of the battery according to a terminal voltage of the battery and a built-in battery model, and calculates the remaining charge in the battery based on SOC-OCV relations, thus, the present disclosure is capable of maintaining the precision of the battery fuel gauging system and can set the battery fuel gauging system inside or outside of the battery.

DETAILED DESCRIPTION OF THE DISCLOSURE

Below a detailed description will be provided on the present disclosure with reference to the attached drawings and the embodiments.

Figure 2:
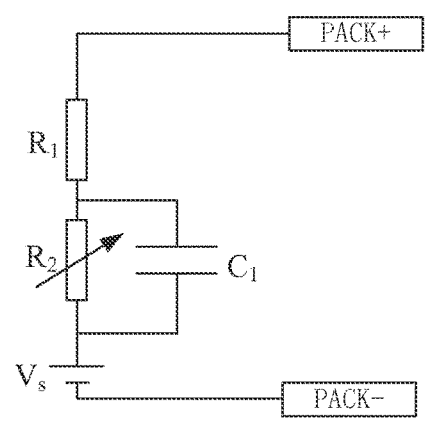
FIG. 2 is a schematic diagram of circuit configuration of a built-in battery model according to the present disclosure.

Referring to FIG. 2, a schematic diagram of circuit configuration of a built-in battery model according to the present disclosure is shown. The built-in battery model is an equivalent circuit through normalized modeling of the battery circuit. The equivalent circuit comprises a first resistor $R_1$, a nonlinear resistor $R_2$, an OCV equivalent voltage source Vs and a first capacitor $C_1$. The first resistor $R_1$, the nonlinear resistor $R_2$ and the OCV equivalent voltage source Vs are connected in series, and the first capacitor $C_1$ and the nonlinear resistor $R_2$ are connected in parallel. While another terminal of the first resistor $R_1$ is connected to a positive terminal PACK+ of the battery, and a negative terminal of the OCV equivalent voltage source Vs is connected to a negative terminal PACK− of the battery.

In the built-in battery model, the first resistor $R_1$ represents an equivalent resistance of the battery, which is primarily determined by metal contact points and the conductivity of the electrolyte. Generally, the first resistor $R_1$ does not vary with the magnitude of the current. The nonlinear resistor $R_2$ represents a voltage drop caused by the polarization voltage differential of the battery. The first capacitor $C_1$ represents a responding speed of the polarization voltage differential to the current excitation. The nonlinear resistor $R_2$ and the first capacitor $C_1$ jointly determine a time constant $\tau = R_2 * C_1$. The OCV equivalent voltage source Vs represents an open-circuit voltage $V_{ocv}$ of the battery when no load is connected. The first resistor $R_1$, the nonlinear resistor $R_2$ and the first capacitor $C_1$ are determined by intrinsic characteristics of the battery.

Figure 3:
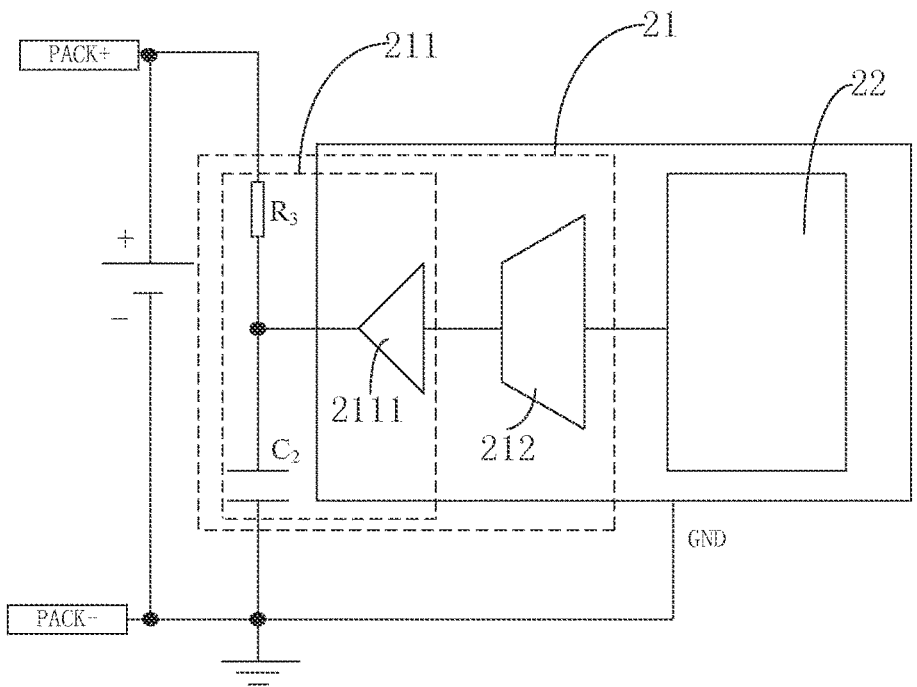
FIG. 3 is a structural diagram of a battery gauging system according to a preferred embodiment of the present disclosure.

Referring to FIG. 3, a structural diagram of a battery gauging system according to a preferred embodiment of the present disclosure is shown. The battery fuel gauging system preferably comprises a battery voltage collecting module 21 and a microprocessor module 22.

An input terminal of the battery voltage collecting module 21 is connected to the battery. The battery voltage collecting module 21 is configured to collect a terminal voltage of the battery and convert the terminal voltage to digital voltage signals and output the digital voltage signals, i.e., the terminal voltage of the battery is represented by analog voltage signals, while the battery voltage collecting module 21 converts the terminal voltage of the battery to digital voltage signals. In particular, the battery voltage collecting module 21 comprises a voltage sampling unit 211 and an analog-to-digital conversion unit 212. The voltage sampling unit 211 is configured to collect the terminal voltage of the battery. The analog-to-digital conversion unit 212 is configured to convert the terminal voltage of the battery to the digital voltage signals.

In the current embodiment, the voltage sampling unit 211 is preferably a high input resistance amplifier, and comprises a second resistor $R_3$, a second capacitor $C_2$ and an amplifier 2111. The voltage sampling unit 211 comprises at its front end a low pass filter comprised by the second resistor $R_3$ and the second capacitor $C_2$. When measuring the charge level of the battery, an input terminal of the amplifier 2111 is connected to a positive terminal PACK+ of the battery via the second resistor $R_3$, and to a negative terminal PACK− of the battery via the second capacitor $C_2$. The second capacitor $C_2$ and the negative terminal of the battery are both connected to the ground. The high input resistance amplifier servers as a buffer when the system is working continuously. It should be noted that, in other embodiments, the voltage sampling unit 211 may also be a switched capacitor circuit.

The microprocessor module 22 is connected to an output terminal of the battery voltage collecting module 21, and particularly, connected to an output terminal of the analog-to-digital conversion unit 212. The microprocessor module 22 is configured to receive the terminal voltage that's been converted to digital voltage signals and to estimate the remaining charge in the battery. In this embodiment, the microprocessor module 22 is preferably a digital signal processor (DSP); in other embodiments, the microprocessor module 22 can also be other programmable logic devices that are programmed with certain algorithms. Ground connection pins of the amplifier 2111, the analog-to-digital conversion unit 212 and the microprocessor module 22 are all common-grounded with the negative terminal of the battery.

The battery fuel gauging system according to the current embodiment only needs to respectively connect the two terminals of the battery to the two terminals of the battery fuel gauging system, thus, the battery fuel gauging system according to the present embodiment cannot only be set inside the battery, but also be located outside the battery, e.g., located in a mobile communication device or a printed circuit board (PCB) of other electronic devices of the battery's load. Since the battery fuel gauging system can be set outside the battery, and needs not to be directly powered by the battery, the battery voltage collecting module 21 may work intermittently, i.e., intermittently collect the terminal voltage of the battery. In particular, the system needs not to work under a real-time mode but only needs to regularly measure the terminal voltage of the battery. In light of this, the analog-to-digital conversion unit 212 may also need not to work in a continuous mode, enabling the system to work under a low-power state for the majority of the time, thus profoundly reducing the overall power consumption of the system.

Below the working process of the battery fuel gauging system will be illustrated with reference to the built-in battery model as shown in FIG. 2.

Figure 4:
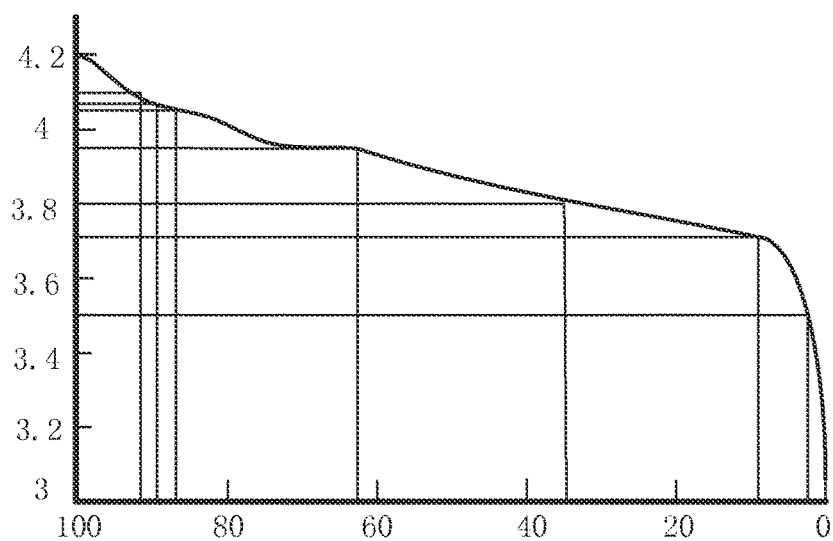
FIG. 4 is a schematic diagram of SOC-OCV (state of charge-open-circuit voltage) corresponding relations.

The battery voltage collecting module 21 collects the terminal voltage of the battery and converts the terminal voltage to digital voltage signals and outputs the digital voltage signals. The microprocessor module 22 receives the terminal voltage as in the form of digital voltage signals, and estimates the open-circuit voltage of the battery according to the terminal voltage of the battery in conjunction with the built-in battery model, and further calculates the remaining charge in the battery based on the SOC-OCV (state of charge-Open-Circuit Voltage) correspondence of the typical lithium-ion battery. As is shown in FIG. 4, which is an example curve of the SOC-OCV corresponding relations of a typical lithium-ion battery. It can be observed that each SOC value is paired with exactly one OCV value, thus a table-look-up method may be applied to deduce a corresponding SOC value from an OCV value and vice versa.

Figure 1:
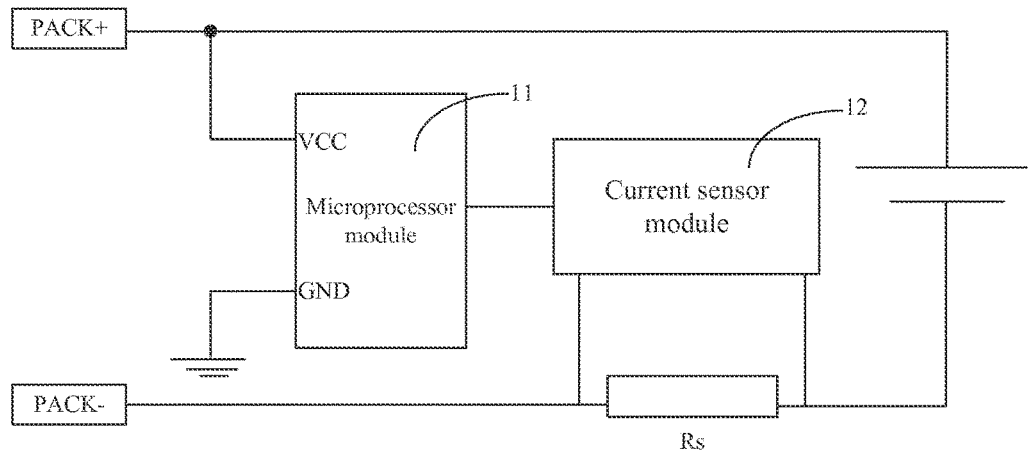
FIG. 1 is a structural diagram of a battery fuel gauging system in the prior art.

As is shown in FIG. 1, it can be known from the structure of the built-in battery model that, the equations depicting the relations between the terminal voltage $V_o(t)$ of the battery and the open-circuit voltage $V_{ocv}(t)$ of the battery can be as following:

$$V_o(t) = V_{ocv}(t) - I_1(t) * R_1 - I_2(t) * R_2 \quad (1)$$

wherein, $V_o(t)$ is the terminal voltage of the battery, $V_{ocv}(t)$ is the open-circuit voltage of the battery, $I_1(t)$ is the current flowing through the first resistor $R_1$, in particular. $I_1(t)$ is the charge current when the battery is charging, and is the discharge current when the battery is discharging. $R_1$ is the resistance value of the first resistor $R_1$. $I_2(t)$ indicates the current flowing through the nonlinear resistor $R_2$. $R_2$ is the resistance value of the nonlinear resistor. $I_1(t)$ may be estimated by a SOC characteristic equation of the battery, and $I_2(t)$ may be calculated according to relational equations with regard to $I_1(t)$ and $I_2(t)$ in the equivalent circuit of the battery.

Furthermore, the characteristic equation of the battery's SOC is:

$$SOC(t) = SOC(0) - \int_0^t I_1(t) dt \quad (2)$$

wherein, SOC(t) is the remaining charge in the battery at a certain time point, and SOC(0) is the charge amount of the battery in the initial state.

The SOC characteristic equation indicates the relations that, with the discharge amount increases, the remaining charge SOC(t) decreases accordingly. In short, when discharging at 1 C (unit rate, equivalent to the discharge current under the nominal capacity, e.g., for an 800 mAh battery, the corresponding 1 C is 800 mA) for 3600 second, the battery can be discharged from 100% to 0%. Therefore, the discharge rate can be directly utilized to the integral calculation of the charge SOC.

The characteristic of the battery at every time point is in accordance with the above SOC characteristic equation. Thus, the SOC characteristic of the battery at a previous sampling time point can be utilized to estimate the current $I_1(t)$ flowing at a subsequent time point through the first resistor $R_1$, thereby ensuring the accuracy of the real-time data. Due to the fact that no matter the battery load is working in the normal operation mode, the sleep mode, the standby mode or the ultra-low-power mode, the current $I_1(t)$ flowing through the first resistor $R_1$ at the subsequent time point is calculated according to the SOC characteristic of the battery at the previous time point, the battery fuel gauging system according to the present embodiment is capable of accommodating to various loading conditions.

$I_2(t)$ is calculated according to the relational equation with regard to $I_1(t)$ and $I_2(t)$ in the built-in battery model. The relational equation of $I_1(t)$ and $I_2(t)$ in the built-in battery model is:

$$I_2(t) * R_2 = V_{C_1}(t) \quad (3)$$

$$\int_0^t \frac{I_2 - I_1}{C_1} dt = V_{C_1}(t) \quad (4)$$

wherein, $V_{c1}(t)$ is the voltage between the two terminals of the first capacitor.

Based on the above equations (1), (2), (3) and (4), the current $I_1(t)$ flowing through the first resistor $R_1$ and the current $I_2(t)$ flowing through the nonlinear resistor $R_2$ can be calculated, after which $I_1(t)$ and $I_2(t)$ can be substituted into formula (1), whereby the open-circuit voltage $V_{ocv}(t)$ of the battery can be obtained in conjunction with the terminal voltage $V_0(t)$ of the battery sampled at the very time point. Further the remaining charge in the battery can be calculated according to the SOC-OCV relations of the typical lithium-ion battery. The remaining charge in the battery and the open-circuit voltage has one-to-one corresponding relations.

The corresponding relations can be categorized into two types, wherein in the first type, a relational table correlating the open-circuit voltage of the battery and the remaining charge is established based on the characteristic of the battery; in the second type, relational data concerning the open-circuit voltage of the battery and the remaining charge is established based on the characteristic of the battery, and further a relational polynomial set concerning the open-circuit voltage of the battery and the remaining charge is obtained through segmented polynomial fitting. With regard to the first type, the open-circuit voltage needs to be calculated according to the terminal voltage of the battery, and further the corresponding remaining charge will be obtained by looking up the table. If the open-circuit voltage of the battery is amidst a plurality of discrete data points, then linear interpolation will be utilized to estimate the open-circuit voltage and further calculate the remaining charge in the battery. With regard to the second type, the open-circuit voltage needs to be calculated according to the terminal voltage of the battery, and the open-circuit voltage will be substituted into the relational equation set correlating the open-circuit voltage and the remaining charge in order to calculate the remaining charge.

The battery fuel gauging system according to the present disclosure estimates an open-circuit voltage of the battery according to the terminal voltage of the battery and a built-in battery model, and calculates the remaining charge in the battery based on SOC-OCV relations of the typical Lithium ion battery. By the above manner, the present disclosure can be accommodated to various battery load conditions, and can maintain the measurement precision and reduce the system's power consumption, and can further set the battery fuel gauging system inside or outside of the battery.

What is described above is merely the embodiments of the present disclosure, thus shouldn't be construed to be limiting the patent scope of the present disclosure. Any equivalent structures or equivalent process flow modifications that are made according to the specification and the attached drawings of the present disclosure, or any direct or indirect applications of the present disclosure in other related technical fields shall all be covered within the scope of the present disclosure.

What is claimed is:
1. A battery fuel gauging system, comprising:
   a battery comprising a terminal voltage, an open-circuit voltage and a built-in battery model;
   a battery voltage collecting module comprising an input terminal and an output terminal, the input terminal being connected to the battery and configured to collect the terminal voltage of the battery, wherein the battery voltage collecting module works intermittently;
   a microprocessor module, being connected to the output terminal of the battery voltage collecting module and configured to receive the terminal voltage of the battery and estimate remaining charge in the battery;
   wherein, the microprocessor module estimates the open-circuit voltage of the battery according to the terminal voltage of the battery in conjunction with the built-in battery model, and further calculates the battery's remaining charge based on SOC-OCV(state of charge-open-circuit voltage) relations of a typical lithium-ion battery, the built-in battery model is described by the following equation set:

$$V_o(t) = V_{ocv}(t) - I_1(t) * R_1 - I_2(t) * R_2 \quad (1)$$

$$I_2(t) * R_2 = V_{C_1}(t) \quad (2)$$

$$\int_0^t \frac{I_2 - I_1}{C_1} dt = V_{C_1}(t) \quad (3)$$

$$SOC(t) = SOC(0) - \int_0^t I_1(t) dt \quad (4)$$

wherein, $V_o(t)$ represents the terminal voltage of the battery, $V_{ocv}(t)$ represents the open-circuit voltage of the battery, $R_1$ represents an equivalent ohmic resistance of the battery, $R_2$ represents an equivalent polarization differential resistance, $I_1(t)$ represents charge current or discharge current of the battery, and $I_2(t)$ represents the current flowing through the equivalent polarization differential resistance $R_2$, SOC(t) is the present remaining charge in the battery, and SOC(0) is initial charge amount of the battery, $C_1$ represents a responding speed of the polarization voltage differential to current excitation and is decided by the intrinsic characteristics of the battery, the present open-circuit voltage of the battery is calculated according to the built-in battery model in conjunction with the presently collected terminal voltage of the battery, and the present open-circuit voltage of the battery is further utilized to calculate the remaining charge in the battery according to the SOC-OCV relations of the typical lithium-ion battery.

2. The battery fuel gauging system according to claim 1, wherein a relational table correlating the open-circuit voltage of the battery and the remaining charge is established according to characteristics of the battery, and the open-circuit voltage is calculated according to the terminal voltage of the battery, and further the corresponding remaining charge is obtained by looking up the table, when the open-circuit voltage of the battery is amidst a plurality of discrete data points, linear interpolation is utilized to calculate the remaining charge in the battery.

3. The battery fuel gauging system according to claim 1, wherein relational data correlating the open-circuit voltage of the battery and the remaining charge is established according to characteristics of the battery, and a relational polynomial set correlating the open-circuit voltage of the battery and the remaining charge is retained, further the open-circuit voltage of the battery is calculated according to the terminal voltage of the battery, and finally the open-circuit voltage is substituted into the polynomial set correlating the open-circuit voltage of the battery and the remaining charge.

4. A battery fuel gauging system, comprising:
a battery comprising a terminal voltage, an open-circuit voltage and a built-in battery model;
a battery voltage collecting module comprising an input terminal and an output terminal, wherein the input terminal of the battery voltage collecting module is connected to the battery and configured to collect the terminal voltage of the battery;
a microprocessor module, being connected to the output terminal of the battery voltage collecting module and configured to receive the terminal voltage of the battery and estimate remaining charge in the battery;
wherein the microprocessor module estimates the open-circuit voltage of the battery according to the terminal voltage of the battery and the built-in battery model, and further calculates the battery's remaining charge based on SOC-OCV relations of a typical lithium-ion battery;
wherein the battery voltage collecting module comprises a voltage sampling unit and an analog-to-digital conversion unit.

5. The battery fuel gauging system according to claim 4, wherein the voltage sampling unit is a switched capacitor circuit or a high input resistance amplifier.

6. The battery fuel gauging system according to claim 4, wherein the voltage sampling unit comprises at its front end a low pass filter.

7. The battery fuel gauging system according to claim 4, wherein the battery voltage collecting module works intermittently.

8. The battery fuel gauging system according to claim 4, wherein the microprocessor module is a digital signal processor (DSP).

9. The battery fuel gauging system according to claim 4, wherein the microprocessor module is a programmable device programmed with certain algorithms.

10. The battery fuel gauging system according to claim 4, wherein the built-in battery model is described by the following equation set:

$$V_o(t) = V_{ocv}(t) - I_1(t) * R_1 - I_2(t) * R_2 \quad (1)$$

$$I_2(t) * R_2 = V_{C_1}(t) \quad (2)$$

$$\int_0^t \frac{I_2 - I_1}{C_1} dt = V_{C_1}(t) \quad (3)$$

$$SOC(t) = SOC(0) - \int_0^t I_1(t)dt \quad (4)$$

wherein, $V_o(t)$ represents the terminal voltage of the battery, $V_{ocv}(t)$ represents the open-circuit voltage of the battery, $R_1$ represents an equivalent ohmic resistance of the battery, $R_2$ represents an equivalent polarization differential resistance, $I_1(t)$ represents charge current or discharge current of the battery, and $I_2(t)$ represents the current flowing through the equivalent polarization differential resistance $R_2$, SOC(t) is the present remaining charge in the battery, and SOC(0) is initial charge amount of the battery, $C_1$ represents a responding speed of the polarization voltage differential to current excitation and is decided by the intrinsic characteristics of the battery, the present open-circuit voltage of the battery is calculated according to the built-in battery model in conjunction with the presently collected terminal voltage of the battery, and the current open-circuit voltage of the battery is further utilized to calculate the remaining charge in the battery according to the SOC-OCV relations of the typical lithium-ion battery.

11. The battery fuel gauging system according to claim 10, wherein a relational table correlating the open-circuit voltage of the battery and the remaining charge is established according to characteristics of the battery, and the open-circuit voltage is calculated according to the terminal voltage of the battery, and further the corresponding remaining charge is obtained by looking up the table, when the open-circuit voltage of the battery is amidst a plurality of discrete data points, linear interpolation is utilized to calculate the remaining charge in the battery.

12. The battery fuel gauging system according to claim 10, wherein relational data correlating the open-circuit voltage of the battery and the remaining charge is established according to characteristics of the battery, and a relational polynomial set correlating the open-circuit voltage of the battery and the remaining charge is retained, further the open-circuit voltage of the battery is calculated according to the terminal voltage of the battery, and finally the open-circuit voltage is substituted into the polynomial set correlating the open-circuit voltage of the battery and the remaining charge.

13. A battery fuel gauging method, wherein the battery comprises a terminal voltage $V_o(t)$, an open-circuit voltage $V_{ocv}(t)$ and a built-in battery model, comprising:
establishing SOC-OCV (state of charge-open-circuit voltage) relations of a typical lithium-ion battery, wherein the SOC-OCV relations are the relations between the open-circuit voltage $V_{ocv}(t)$ of the battery and present remaining charge SOC(t) in the battery;

establishing the built-in battery model of the battery, the built-in battery model of the battery being described by the following equation set:

$$V_o(t) = V_{ocv}(t) - I_1(t) * R_1 - I_2(t) * R_2 \quad (1)$$

$$I_2(t) * R_2 = V_{C_1}(t) \quad (2)$$

$$\int_0^t \frac{I_2 - I_1}{C_1} dt = V_{C_1}(t) \quad (3)$$

$$SOC(t) = SOC(0) - \int_0^t I_1(t) dt \quad (4)$$

wherein, $V_o(t)$ represents the terminal voltage of the battery, $V_{ocv}(t)$ represents the open-circuit voltage of the battery, $R_1$ represents an equivalent ohmic resistance of the battery, $R_2$ represents an equivalent polarization differential resistance, $I_1(t)$ represents charge current or discharge current of the battery, and $I_2(t)$ represents the current flowing through the equivalent polarization differential resistance $R_2$, $SOC(t)$ is the present remaining charge in the battery, and $SOC(0)$ is initial charge amount of the battery, $C_1$ represents a responding speed of the
polarization voltage differential to current excitation and is decided by the intrinsic characteristics of the battery, equation (4) is an SOC characteristic equation of the battery, with which the SOC characteristic of the battery at every time point is in accordance;
estimating the charge current or discharge current $I_1(t)$ of the battery at a present time point depending on the SOC characteristic of the battery at a previous sampling time point;
calculating the current $I_2(t)$ flowing through the polarization differential resistance $R_2$ according to equations (2) and (3) with the present charge current or discharge current $I_1(t)$ of the battery;
calculating the present open-circuit voltage $V_{ocv}(t)$ of the battery according to equation (1) together with the present charge current or discharge current Ii(t) of the battery, the present current $I_2(t)$ flowing through the polarization differential resistance $R_2$, and a presently collected terminal voltage $V_o(t)$ of the battery; and
estimating the remaining charge in the battery, according to the SOC-OCV relations of the typical battery model with the present open-circuit voltage of the battery.

14. The battery fuel gauging method according to claim 13, wherein the step of estimating the remaining charge in the battery according to the SOC-OCV relations of the typical battery model with the present open-circuit voltage of the battery comprises the following steps:
establishing a relational table correlating the open-circuit voltage of the battery and the remaining charge in the battery;
looking up the table to obtain the present remaining charge in the battery corresponding to the present open-circuit voltage of the battery;
when the present open-circuit voltage of the battery is amidst a plurality of discrete data points, utilizing linear interpolation to calculate the present remaining charge in the battery.

15. The battery fuel gauging method according to claim 13, wherein the step of estimating the remaining charge in the battery according to the SOC-OCV relations of the typical battery model with the present open-circuit voltage of the battery comprises the following steps:
establishing relational data correlating the open-circuit voltage of the battery and the remaining charge in the battery according to the characteristics of the battery;
establishing a relational polynomial set with regard to the open-circuit voltage of the battery and the remaining charge in the battery;
substituting the present open-circuit voltage of the battery into the polynomial set to calculate the present remaining charge in the battery.

16. The battery fuel gauging method according to claim 13, further comprising:
providing a battery voltage collecting module comprising an input terminal and an output terminal, and a microprocessor module;
connecting the input terminal of the battery voltage collecting module to the battery to collect the terminal voltage of the battery;
connecting the microprocessor module to the output terminal of the battery voltage collecting module to receive the terminal voltage of the battery and estimate the remaining charge in the battery;
wherein the microprocessor module estimates the open-circuit voltage of the battery according to the terminal voltage of the battery and the built-in battery model, and further calculates the battery's remaining charge based on the SOC-OCV relations of the typical lithium-ion battery.

17. The battery fuel gauging method according to claim 16, wherein the battery voltage collecting module works intermittently.

18. The battery fuel gauging method according to claim 16, wherein the battery collecting module comprises a voltage sampling unit and an analog-to-digital conversion unit.

19. The battery fuel gauging method according to claim 16, wherein the microprocessor module is a digital signal processor (DSP) or a programmable device programmed with certain algorithms.

* * * * *